United States Patent [19]

Hasegawa et al.

[11] Patent Number: 4,585,686
[45] Date of Patent: Apr. 29, 1986

[54] TWO-LAYER STRUCTURE MOLDED BY USING THERMOPLASTIC RESIN

[75] Inventors: Tadashi Hasegawa, Nagoya; Kazuyuki Izumo, Aichi; Katsuyuki Enomoto, Aichi; Nobuyoshi Sugie, Aichi, all of Japan

[73] Assignee: Aron Kasei Co., Ltd., Tokyo, Japan

[21] Appl. No.: 682,432

[22] Filed: Dec. 17, 1984

[30] Foreign Application Priority Data

Dec. 28, 1983 [JP] Japan ............................ 58-204834[U]

[51] Int. Cl.⁴ .......................... B32B 3/30; B32B 27/06
[52] U.S. Cl. .................................... 428/172; 252/500; 428/323; 428/328; 428/329
[58] Field of Search ............... 428/172, 139, 329, 328, 428/323; 252/500, 512, 518

[56] References Cited

U.S. PATENT DOCUMENTS

| | | | |
|---|---|---|---|
| 4,137,361 | 1/1979 | Deffeyes | 428/328 |
| 4,218,507 | 8/1980 | Deffeyes et al. | 252/512 |
| 4,447,492 | 5/1984 | McKaveney | 428/328 |

Primary Examiner—Paul J. Thibodeau
Attorney, Agent, or Firm—Cooper, Dunham, Clark, Griffin & Moran

[57] ABSTRACT

A two-layer structure molded by using thermoplastic resin is provided in the instant invention. Said two-layer structure comprises one layer (a) of thermoplastic resin in which no electroconductive filler is mixed, and the other layer (b) of thermoplastic resin in which electroconductive filler is mixed wherein one or more projections which penetrate said layer (b) are formed on said layer (a).

6 Claims, 3 Drawing Figures

TWO-LAYER STRUCTURE MOLDED BY USING THERMOPLASTIC RESIN

BACKGROUND OF THE INVENTION

1. Field of the Invention

The present invention relates to a two-layer structure used as a material for housings possessing an excellent electromagnetic shielding effectiveness and the like. More particularly, the present invention relates to a two-layer structure molded by using thermoplastic resin comprising one layer (a) of thermosplastic resin in which no electroconductive filler is mixed, and the other layer (b) of thermosplastic resin in which electroconductive filler is mixed wherein one or more projections which penetrate said layer (b) are formed on said layer (a).

2. Description of the Prior Arts

Recently, thanks to the remarkable development of electronical arts including the development of the IC, LSI and etc., the digital instruments using an IC, LSI and the like, such as the computer, the electronic game machine, the television game machine, the switching electric power source of the electronic cash register, the digital clock, the desk electric computer, the word processor and the like have widely spread to the world. Said electric articles and electronic instruments advantageously use plastics as materials of their housings because the housings using plastics as the matterials are easily mass-produced, because plastics have an excellent moldability and processability and have good insulating property.

On the other hand, digital instruments generate the electromagnetic wave more than 10,000 pulse/sec to the space and said electromagnetic wave may disturb the satisfactory radio, TV, wireless telegraph reception and the like because plastics as materials of housings are transmissible for the electromagnetic wave and therefore the problem of shielding from the electromagnetic wave has become important to protect against the disturbance of the electromagnetic wave.

Hitherto, the thermoplastic resin mixed with the metal filler has been studied as the material of housings. Nevertheless, said plastics have disadvantages that the metal filler in the plastics may be exposed on the surface of molded housings, so the appearance of housings becomes inferior, and the mechanical strength and the insulation resistance decrease and the like. Formerly, housings having a two-layer structure molded by using thermoplastic resin comprising one layer (a) of thermoplastic resin in which no electroconductive filler is mixed, and the other layer (b) of thermoplastic resin in which electroconductive filler is mixed were provided by inventors of the present invention. Said housings have desirable appearance owing to said layer (a) as the outer layer and a desirable electromagnetic shielding effectiveness owing to said layer (b) as the inner layer.

Nevertheless, the mechanical strength of the layer (b) is somewhat less than that of the layer (a) as electroconductive filler is mixed in thermoplastic resin of the layer (b), and moreover, necessary projection(s), such as boss(es), franges, rib(s) and the like, has(have) been generally formed on the layer (b) having less mechanical strength. Thus, the stress on the two-layer structure may concentrate on said projection(s) and as a result, there has arisen a high risk of fractures of said two-layer structure around the site of the projection(s) of the layer (b).

SUMMARY OF THE INVENTION

Accordingly, an object of the present invention is to prevent fractures of a two-layer structure molded by using thermoplastic resin comprising one layer (a) of thermoplastic resin in which no electroconductive filler is mixed, and the other layer (b) of thermoplastic resin in which electroconductive filler is mixed.

Another object of the present invention is to provide a two-layer structure molded my using thermoplastic resin and having an excellent strength against the delamination.

Further object of the present invention is to give an excellent electromagnetic shielding effectiveness to said two-layer structure molded my using thermoplastic resin.

Briefly, said objects can be attained by a two-layer structure molded by using thermoplastic resin comprising one layer (a) of thermoplastic resin in which no electroconductive filler is mixed, and the other layer (b) of thermoplastic resin in which electroconductive filler is mixed wherein one or more projections which penetrate said layer (b) are formed on said layer (a).

DETAILED DESCRIPTION

Figure 1:
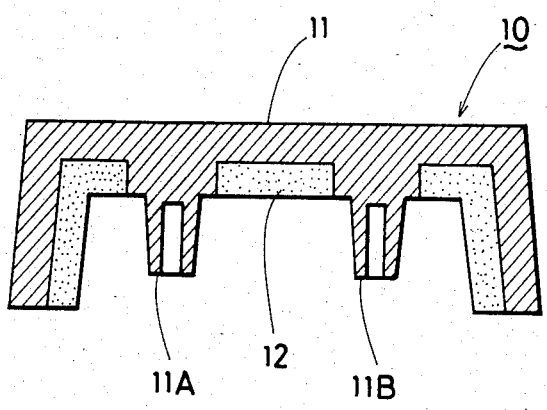
FIG. 1 shows a sectional view of an embodiment of the two-layer structure of the present invention.

Reffering now to FIG. 1, in a two-layer structure (10), (11) is one layer (a) of thermoplastic resin in which no electroconductive filler is mixed and (12) is the other layer (b) of thermoplastic resin in which electroconductive filler is mixed. Two layers (11) and (12) are attached to each other and two bosses (11)A and (11)B which penetrate said layer (12) and project from the surface of the layer (12) respectively. Diameters of projections, said two bosses (11)A and (11)B, may desirably be 1/60 or below wavelength of the electromagnetic wave affecting on the two-layer structure (10) respectively. For instance, in case that 500 MHz in the frequency of the electromagnetic wave affects on the two-layer structure (10), diameters of projections, said two bosses (11)A and (11)B, may be calculated as follows.

$$\frac{\text{Speed of the electromagnetic wave}}{\text{Frequency}} = \text{wavelength} \quad (1)$$

$$\text{Diameter of projection} \leq \text{wavelength} \times 1/60 \quad (2)$$

Accordingly, substituting above described figures for said formula (1) and then said formula (2)

$$\frac{3 \times 10^{11} \text{ m/s}}{5 \times 10^8 \text{ c/s}} = 600 \text{ mm} \quad (1)$$

$$\text{Diameter of projection} \leq 600^{mm} \times 1/60 = 10 \text{ mm} \quad (2)$$

Thus, in this case, diameters of projections, two bosses (11)A and (11)B, may be 10 mm or below respectively.

In case that the diameter of the projection is 1/60 or below wavelength of the electromagnetic wave, the leakig the electromagnetic wave through the two-layer structure at the site of the projection may be effectively prevented and an excellent electromagnetic shielding effectiveness of the two-layer structure may be obtained. Relation between the diameter of the projection and the electromagnetic shielding effectiveness of the two-layer structure in case that 500 MHz in the frequency of the electromagnetic wave affects on the two-layer structure is shown in Table 1.

TABLE 1

| Diameter of Projection (mm) | The electromagnetic shielding effectiveness |
| --- | --- |
| Contrast* | 60 dB |
| 8 | 58 dB |
| 12 | 40 dB |

*In Table 1, Contrast is a sample of the two-layer structure having no projection.

As shown in Table 1, it is clear that the electromagnetic shielding effectiveness of the sample of the two-layer structure having the projection of 8 mm in diameter is similar to Contrast, while that of the sample of the two-layer structure having the projection of 12 mm in diameter is considerably less than Contrast.

Said thermoplastic resin used as material of said layer (a) and layer (b) may be such as polyvinylchloride, polyamide, acrylonitrile-butadiene-styrene copolymer (ABS), polystyrene, polyphenylene-oxide, polypropylene, polyethylene, polycarbonate and the like. Two or more kinds of the thermoplastic resin may be mixed together.

Said electroconductive filler is mixed into the thermoplastic resin (resin B) in said layer (b) and no electroconductive filler is mixed into the thermoplastic resin (resin A) in said layer (a).

Desirable combinations of the resin A and the resin B for injection molding, compatability between the resin A and the resin B, and the like are shown in Table 2.

TABLE 2

| Resin A | Resin B |
| --- | --- |
| Polystyrene | Polystyrene |
| Polyphenylene-oxide | Polystyrene |
| ABS | ABS |
| Polycarbonate | ABS |
| Polyvinylchloride | ABS |
| Polyamide | Polyamide |
| ABS | Polycarbonate |
| Polycarbonate | Polycarbonate |
| Polyethylene | Polypropylene |
| Polystyrene | Polyphenylene-oxide |
| ABS | Polyvinylchloride |
| Polymethylmethacrylate | Polyvinylchloride |
| Polyvinylchloride | Polyvinylchloride |

Said electroconductive filler may be metal and/or alloy, such as silver, copper, nickel, brass, stainless steel, and the like, or carbon and the like. Said electroconductive filler is provided in the form of powder, flake, fiber and the like. Further, metal coated glass, plastic, ceramic and the like in the form of flake, fiber and the like are also used as the filler of the present invention. Two or more kinds of the filler may be mixed into the resin B.

Desirable forms of the filler for moldability and blendability may be fibers having a diameter of 10 to 100 mm and a length of 10 mm or below, desirably 1 to 4 mm, or flakes having a surface area of 4 mm$^2$ or below and a thickness of 0.1 mm or below.

Generally, the desirable mixing amount of the electroconductive filler may be 10 to 25 volume % for the moldability and the electromagnetic shielding effectiveness. Typical examples of combination of the filler and the resin B are shown in Table 3.

TABLE 3

| Resin B Filler | Polystyrene | Polystyrene | ABS | ABS | Polyphenylene oxide |
| --- | --- | --- | --- | --- | --- |
| Blass fibers | 3 | — | — | 2 | — |
| Aluminum flakes | 18 | 20 | 13 | 8 | 10 |
| Aluminum fibers | 4 | 2 | 2 | | 5 |

Figure 2:
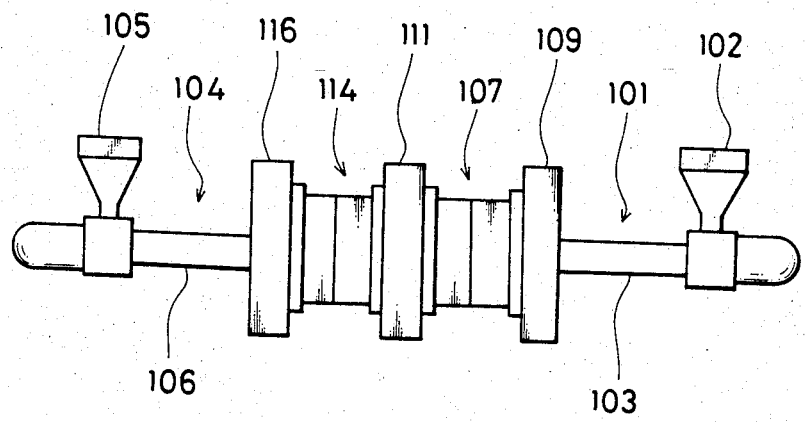
FIG. 2 shows a side view of the main part of an embodiment of the injection molding machine used for molding the two-layer structure of the present invention.
Figure 3:
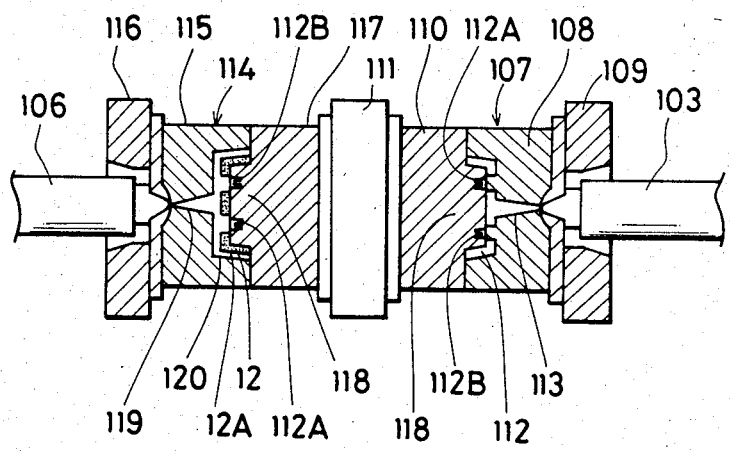
FIG. 3 shows a vertical sectional view of the main part of the embodiment.

The two-color injection molding machine shown in FIGS. 2 and 3 is advantageously used to mold the two-layer structure of the present invention. The resin B is combined according to such as the examples shown in Table 3 and uniformly mixed by the extruder to produce a compound.

Referring to Figures, said compound is charged into a hopper (102) of a primary injection-molding unit (101) and softened in a cylinder (103) by heating. On the other hand, the resin A selected according to such as the combinations shown in Table 2 is charged into a hopper (105) of a secondary injection-molding unit (104) and softened in a cylinder (106) by heating. As shown in FIG. 3, a primary injection mold (107) consists of a primary movable injection mold part (108) fixed on a primary movable die-plate (109), and a primary fixed injection mold part (110) fixed on a rotating die-plate (111) which is horizontally rotatable. A cavity (112) having boss parts (112A) and (112B) for molding of one layer is formed between the primary movable injection mold part (108) and the primary fixed injection mold part (110), and a direct gate (113) connects the cavity (112) with the cylinder (103). A secondary injection mold (114) consists of a secondary movable injection mold part (115) fixed on a secondary movable die-plate (116) and a secondary fixed injection mold part (117) fixed on the rotating die-plate (111). Both core parts (118), (118) of the primary fixed injection mold part (110) and the secondary fixed injection mold part (117) have respectively the same shape and size. A cavity (120) for molding of the other layer is formed between the secondary movable injection mold part (115) and the secondary fixed injection mold part (117), and the depth of the cavity (120) is larger than that of the cavity (112) by the thickness of one layer. A direct gate (119) connects the cavity (120) with the cylinder (106).

The resin B mixed with the electroconductive filler (12A) is softened in the cylinder (103) as above described and injection into the cavity (112) through the direct gate (113) to mold the layer (12) having two holes to penetrate two bosses of the layer (11) to be molded. After a proper cooling time, the primary movable injection mold part (108) is separated from the primary fixed injection mold part (110) and the molding material in the direct gate (113) is cut from the resulting molded layer (12), and then the rotating die-plate (111) is rotated at an angle of 180° with the primary fixed injection mold part (110) to combine the primary fixed injection mold part (110) with the secondary movable injection mold part (115). The cavity (120) is thus formed between the primary fixed injection mold part (110) and the secondary movable injection mold part (115) and the layer (12) is found to be inserted in the cavity (120). On the other hand, the secondary fixed injection mold part (117) is also rotated at the same time to combine with the primary movable injection mold part (108) and the cavity (112) having boss parts (112A) is also formed between the secondary fixed injection mold part (117) and the primary movable injection mold part (108). After the mold clamping, the resin A softened in the cylinder (106) is injected into the cavity (112) through the direct gate (119) to mold the layer (11) having two bosses (11)A and (11)B which penetrate the layer (12) in its holes. After a proper cooling time, the primary movable injection mold part (108) is separated from the secondary fixed injection mold part (117) and the molding material in the direct gate (119) is cut from the molded two-layer structure (10), and thus the two-layer structure (10) shown in FIG. 1 is obtained. In the molded two-layer structure (10), the layer (11) and the layer (12) are reciprocally combined into one body, and delamination between the layer (11) and the layer (12) is prevented by the anchor effect of the two bosses (11)A and (11)B of the layer (11) penetrating the layer (12). Further, said two bosses (11)A and (11)B are molded by using the thermoplastic resin A in which no electroconductive filler is mixed, so that the mechanical strength of said two bosses (11)A and (11)B may be more than that of the layer (12). Thus, the fractures of two-layer structure around the site of the two bosses (11)A and (11)B are effectively prevented.

In the above described embodiment, the injection mold has the direct gate, but the fan gate, the tunnel gate and the like may be applied to the resin A for injection molding and any type of already known gate including the direct gate may be applied to the resin B for injection molding in other embodiments.

We claim:

1. A two-layer structure molded by using thermoplastic resin, comprising one layer (a) of thermoplastic resin in which no electroconductive filler is mixed, and the other layer (b) of thermoplastic resin in which electroconductive filler is mixed wherein one or more projections which penetrate said layer (b) are formed on said layer (a); and wherein the diameters of said one or more projections is not greater than 1/60 the wavelength of the electromagnetic wave effecting on said two-layer structure.

2. A two-layer structure molded by using thermoplastic resin in claim 1, wherein said electroconductive filler mixed in the thermoplastic resin of said layer (b) is metal fiber.

3. A two-layer structure molded by using thermoplastic resin in claim 1, wherein said electroconductive filler mixed in the thermoplastic resin of said layer (b) is metal flake.

4. A two-layer structure molded by using thermoplastic resin in claim 2, wherein said metal fiber as the electroconductive filler has a diameter of 10 to 100 $\mu$m and a length of 10 mm or below.

5. A two-layer structure molded by using thermoplastic resin in claim 3, wherein said metal flake as the electroconcuctive filler has a surface area of 4 $mm^2$ or below and a thickness of 0.1 mm or below.

6. A two-layer structure molded by using thermoplastic resin in claim 1, wherein said electroconductive filler is mixed into said thermoplastic resin 10 to 25% in volume.

* * * * *